(12) United States Patent
Park et al.

(10) Patent No.: US 8,054,708 B2
(45) Date of Patent: Nov. 8, 2011

(54) POWER-ON DETECTOR, OPERATING METHOD OF POWER-ON DETECTOR AND MEMORY DEVICE INCLUDING THE SAME

(75) Inventors: Mingun Park, Yongin-si (KR); Chanho Kim, Seoul (KR); Sangwon Hwang, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 141 days.

(21) Appl. No.: 12/604,116

(22) Filed: Oct. 22, 2009

(65) Prior Publication Data

US 2010/0135099 A1 Jun. 3, 2010

(30) Foreign Application Priority Data

Dec. 1, 2008 (KR) .......................... 10-2008-0120598

(51) Int. Cl.
*G11C 7/00* (2006.01)

(52) U.S. Cl. ..................... 365/226; 365/228; 365/189.09

(58) Field of Classification Search .................. 365/226, 365/228, 189.09
See application file for complete search history.

(56) References Cited

U.S. PATENT DOCUMENTS

| | | | | |
|---|---|---|---|---|
| 6,862,236 | B2 * | 3/2005 | Maruyama | 365/202 |
| 7,852,129 | B2 * | 12/2010 | Do | 327/143 |
| 7,929,350 | B2 * | 4/2011 | Hwang | 365/185.19 |
| 2004/0071036 | A1 | 4/2004 | Lee | |
| 2005/0275986 | A1 | 12/2005 | Cho | |

FOREIGN PATENT DOCUMENTS

| | | |
|---|---|---|
| JP | 2001-237684 | 8/2001 |
| KR | 1020040034312 | 4/2004 |
| KR | 1020050118751 | 12/2005 |

* cited by examiner

*Primary Examiner* — Connie Yoha
(74) *Attorney, Agent, or Firm* — F. Chau & Associates, LLC

(57) ABSTRACT

A power-on detector supplied with a power supply voltage from an external source and detects a variation of the power supply voltage. The operating method of the power-on detector comprises calculating the slope of the rise of power supply voltage from a first voltage to a second voltage higher than the first voltage; and calculating the expected time for the power supply voltage to reach a target voltage level, based on the calculated slope.

10 Claims, 9 Drawing Sheets

POWER-ON DETECTOR, OPERATING METHOD OF POWER-ON DETECTOR AND MEMORY DEVICE INCLUDING THE SAME

CROSS-REFERENCE TO RELATED APPLICATIONS

This U.S. non-provisional patent application claims priority, under 35 U.S.C. §119, of Korean Patent Application No. 10-2008-0120598 filed on Dec. 1, 2008, the entirety of which is hereby incorporated by reference.

BACKGROUND

The present invention relates to a power-on detector and a memory device including the power-on detector.

A semiconductor memory device is a data storage apparatus configured to store data and read out the stored data when it is desired. Memory devices may be classified into volatile memory devices and a non-volatile memory devices.

A volatile memory device loses stored data upon power-off. Random Access Memory (RAM) devices such as SRAM, DRAM, SDRAM, are typical volatile memory devices. A non-volatile memory device retains stored data even at power-off. Read Only Memory (ROM) devices such as ROM, PROM, EPROM, EEPROM, and flash memory devices, such as PRAM, MRAM, RRAM, FRAM, and the like are so-called non-volatile memory devices. Flash memory devices may be classified into NOR types and NAND types.

In general, a memory device is powered by an external power (voltage) source. At power-on, there power supply voltage provided from the external source may be gradually increased. The memory device may perform an initialization operation in response to a variation of the power supply voltage. After the power-on, elements of the memory device may perform read and write operations. Thus, at the power-on, a voltage level of the externally applied power supply voltage has to reach a voltage level sufficient to perform read and write operations without errors due to a voltage level of the externally applied power supply voltage.

The externally applied power supply voltage may be unstable at power-on. For example, the externally applied power supply voltage may include ripples. Though a stable voltage level of the externally applied power supply voltage is lower than a first voltage, a conventional power-on detector may judge the externally applied power supply voltage as stable as soon as it reaches a first predetermine voltage. Further, though a stable voltage level of the externally applied power supply voltage is lower than the first predetermined voltage, due to abnormal operation, a conventional power-on detector may prematurely judge the externally applied power supply voltage as stable as soon as it reaches a first voltage.

SUMMARY OF THE INVENTION

Exemplary embodiments of the invention provide a power-on detector and a semiconductor device including the same capable of detecting whether an externally applied power supply voltage reaches a target voltage at power-on.

One aspect of the invention provides an operating method of a power-on detector supplied with a power supply voltage from an external source and operates in response to a variation of the power supply voltage. The operating method comprises calculating the slope of rise of the power supply voltage from a first voltage to a second voltage higher than the first voltage; and calculating the time taken for the voltage level of the power supply voltage to reach a target voltage level (a third voltage higher than the second voltage), based on the calculated slope.

Another aspect of the invention provides a power-on detector comprising a first voltage detector configured to detect when the voltage level of the power supply voltage provided from an external source reaches a first voltage; a second voltage detector configured to detect whether the voltage level of the power supply voltage reaches a second voltage higher than the first voltage; a time counter configured to output a count value; and a calculator configured to calculate the slope of the rising power supply voltage based on the first voltage, the second voltage, and the time count value provided from the counter measuring when the voltage level of the power supply voltage reaches the second voltage from the first voltage.

Another aspect of the invention provides a memory device comprising a memory cell array; a read/write circuit configured to access the memory cell array; and a power supply circuit configured to power the memory cell array and the read/write circuit, wherein the power supply circuit calculates the slope of the rise of the power supply voltage provided from an external source, calculates the expected time for the power supply voltage to reach a target voltage level based on the calculated slope, and generates a control signal when the calculated time elapses.

Electronic devices may be powered by an external voltage source. The electronic devices may perform an initialization/reset operation according to a variation of the power supply voltage applied from the external source at power-on. In an exemplary embodiment, in the case of a memory device, as the power supply voltage provided from the external source increases, the memory device performs a Power-On Reset (POR) operation and a Power-On Read (POR) operation. During the power-on reset operation, elements such as internal latches and/or registers in the memory device are reset. During the power-on read operation, data necessary to operate the memory device is read from its memory cell array or a non-volatile storage device, and the read data is stored in elements such as initialized latches and/or registers. The power-on read operation, data necessary to adjust an externally applied power supply voltage to a given voltage level may be stored in elements such as latches and/or registers.

Further, the memory device may enter a standby state after the power-on read operation is executed. The operation of the memory device may be delayed until the power-on read operation is ended after power-on.

The memory device may include a power-on detector configured to detect the rising voltage level of the externally applied power supply voltage at power-on. The power-on detector may detect whether the externally applied power supply voltage reaches a first voltage. The power-on detector may detect whether the externally applied power supply voltage reaches a second voltage. For example, the second voltage may be a minimum voltage necessary to operate elements of the memory devices normally.

The externally applied power supply voltage may be unstable at power-on. For example, the externally applied power supply voltage may include ripples. Thus, although the voltage level of the externally applied power supply voltage is lower than the second voltage, the power-on detector may judge the externally applied power supply voltage as if it reaches the second voltage. Further, although the voltage level of the externally applied power supply voltage is lower than the second voltage, due to abnormal operations, the power-on detector may judge the externally applied power supply voltage as if it reaches the second voltage.

In order to prevent the above-described problems, the power-on detector is configured to generate a control signal after the voltage level of the externally applied power supply voltage reaches the second voltage and a time elapses. The memory device may perform its reset operation when the control signal is generated from the power-on detector. Thus, after a voltage level of the externally applied power supply voltage reaches the second voltage, the power-on detector waits for a given time interval such that the externally applied power supply voltage is stabilized to a voltage level higher than the minimum voltage level required by the memory device. Thus, at the power-on read operation, a voltage level of the externally applied power supply voltage may have a voltage margin corresponding to voltage rising within a given time with respect to the second voltage.

The slope of the externally applied power supply voltage may be different according to different memory devices.

A voltage detector according to an exemplary embodiment of the present invention and a memory device including the same may wait until the voltage level of the externally applied power supply voltage is stabilized to a voltage higher than or identical to a required minimum voltage level by using the slope of the rise of the externally applied power supply voltage.

Below, there will be described a power-on detector that operates in response to a variation of the externally applied power supply voltage at power-on. Further, there will be described an electronic device that includes the power-on detector and that executes a booting operation in response to a control signal from the power-on detector. The booting operation may include various operations that are necessary to set the electronic device to a standby state after power-on. For example, a booting operation of a memory device may include the above-described power-on read operation. A booting operation of a computing system may include a Power-On Self Test (POST) operation. The electronic device including the disclosed power-on detector are not limited to examples described in this disclosure and a booting operation of an electronic device executed according to a control signal from the power-on detector is not limited to examples mentioned in this disclosure.

Exemplary embodiments of the present invention will be more fully described with reference to accompanying drawings.

BRIEF DESCRIPTION OF THE FIGURES

Exemplary embodiments will be described with reference to the following figures, in which like reference numerals refer to like parts throughout the various figures unless otherwise indicated. In the figures.

DETAILED DESCRIPTION OF EXEMPLARY
EMBODIMENTS OF THE INVENTION

Figure 1:
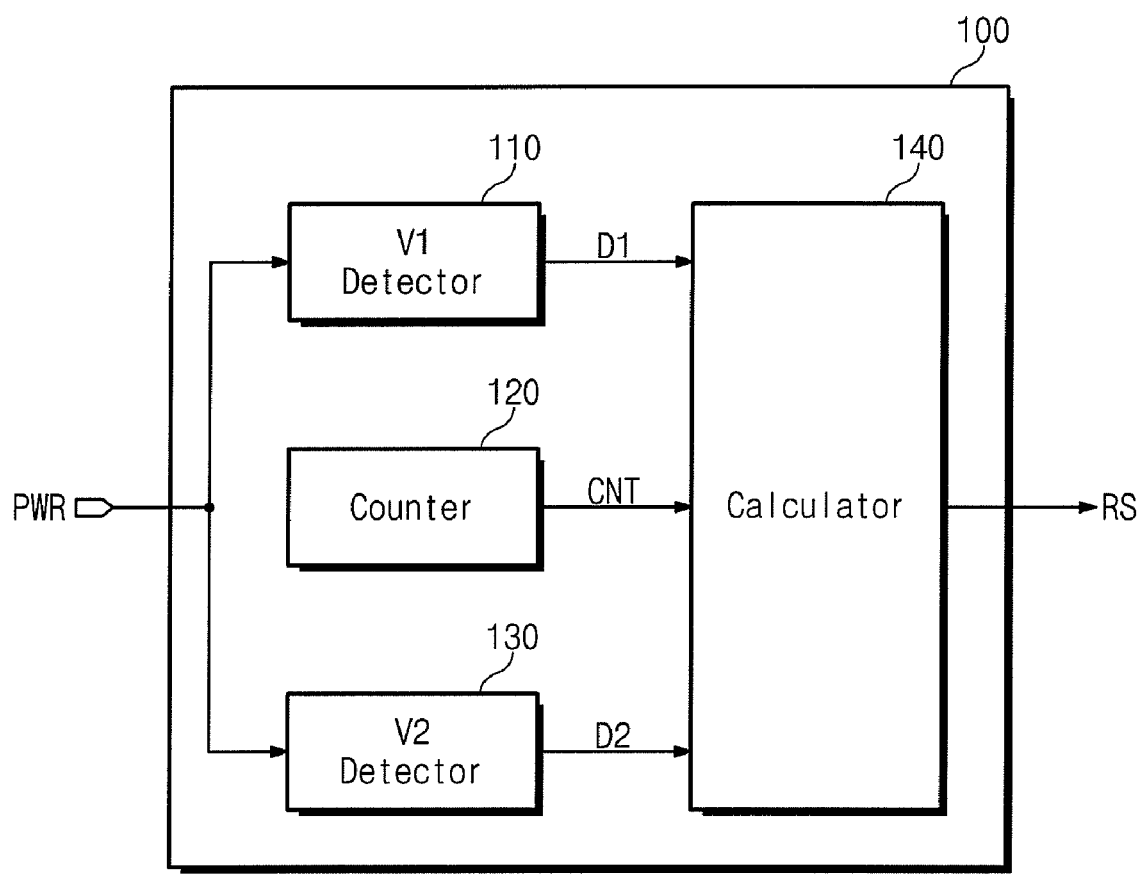
FIG. 1 is a block diagram showing a power-on detector 100 according to one exemplary embodiment of the present invention.

FIG. 1 is a block diagram showing a power-on detector 100 according to an embodiment of the present invention. Referring to FIG. 1, a power-on detector 100 according to the present invention includes the first detector 110, a counter 120, the second voltage detector 130, and a calculator 140.

The power-on detector 100 is supplied with a power supply voltage PWR from the external source. The power supply voltage PWR is supplied to the first and second voltage detectors 110 and 130, respectively. The first voltage detector 110 detects the voltage level of the power supply voltage PWR and generates a signal D1 as the detection result. The second voltage detector 130 detects the voltage level of the power supply voltage PWR and generates a signal D2 as the detection result. The counter 120 generates and sends a count value CNT to the calculator 140.

The calculator 140 is configured to calculate a slope of the power supply voltage PWR in response to the signals D1 and D2 and the count value CNT. The calculator 140 calculates a time taken until a voltage level of the PWR reaches a target level (or, value), based on the calculated slope. The calculator 140 judges whether a time calculated according to the count value CNT elapses. The calculator 140 activates a signal RS when the calculated time elapses before the voltage level of the PWR reaches a target level.

Figure 2:
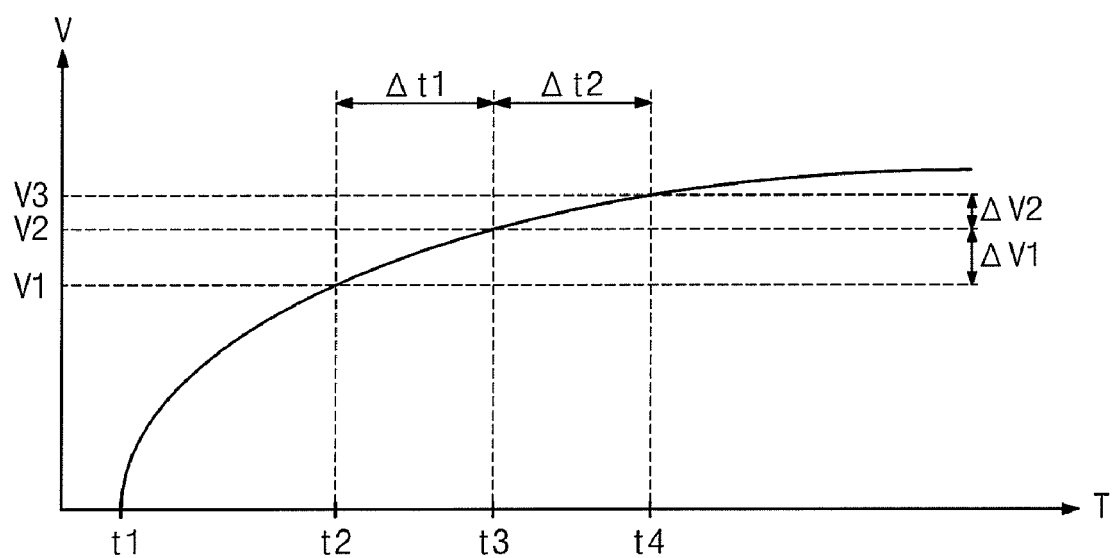
FIG. 2 is a graph showing a variation of a power supply voltage provided from the external voltage source.

FIG. 2 is a graph showing a variation of a power supply voltage provided from the external voltage source. In FIG. 2, the horizontal axis indicates time T, and the vertical axis indicates voltage V.

Figure 3:
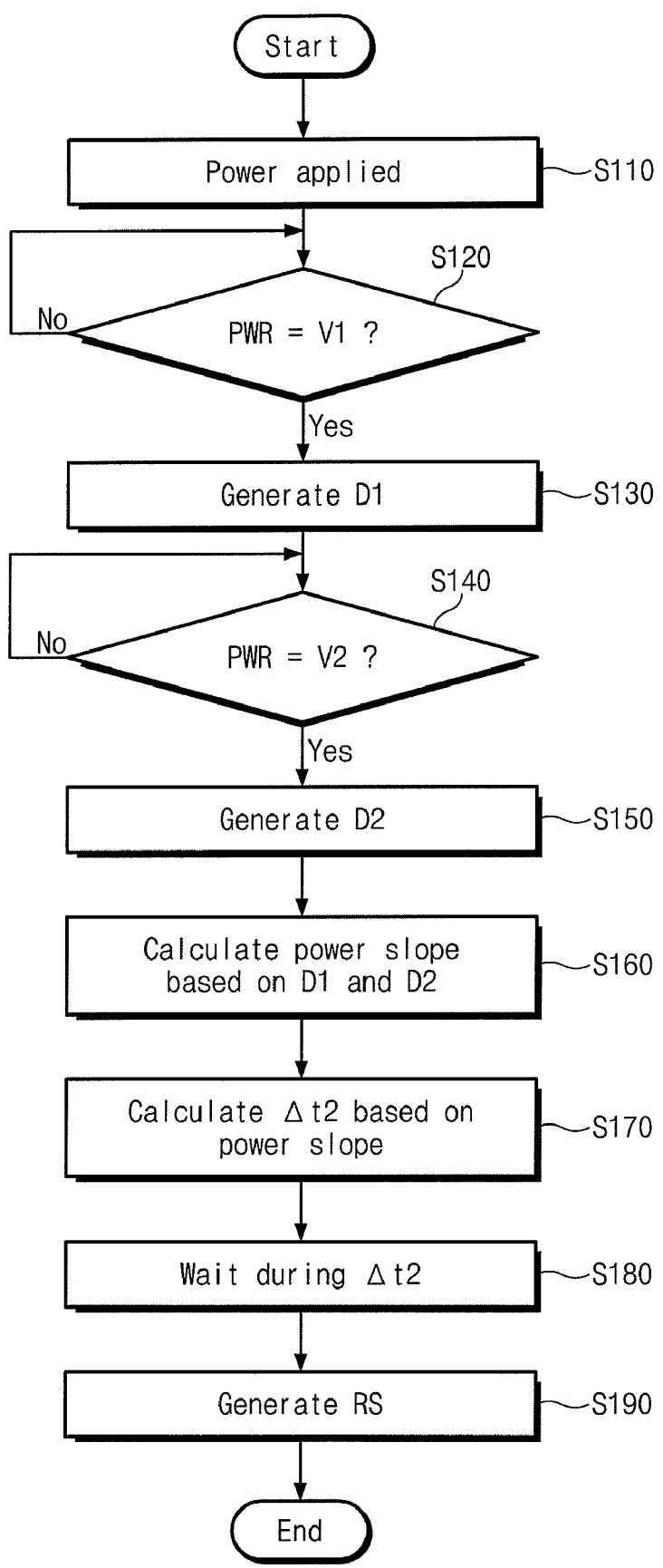
FIG. 3 is a flow chart of the method of operation of the power-on detector 100 of FIG. 1 given the variation of a power supply voltage illustrated in FIG. 2 according to an exemplary embodiment of the present invention.

FIG. 3 is a flow chart of the method of operation of a power-on detector 100 of FIG. 1 given the variation of a power supply voltage illustrated in FIG. 2 according to an exemplary embodiment of the present invention. Below, the method of operation of the power-on detector 100 will be more fully described with reference to FIGS. 1 to 3.

In power applied step S110, a power supply voltage PWR is supplied to a power-on detector 100. As illustrated in FIG. 2, the voltage level of the power supply voltage PWR starts to increase at a time t1. The power-on detector 100 is activated at the time t1.

In decision step S120, it is decided whether the voltage level of the power supply voltage PWR has reached the first voltage V1. The power-on detector 100 may stand by (wait) until the voltage level of the power supply voltage PWR reaches the first voltage V1. If the voltage level of the power supply voltage PWR reaches the first voltage V1 (YES branch of decision step 120), then step S130 is performed, in which the first voltage detector 110 activates a signal D1. In an exemplary embodiment, when the first voltage detector 110 activates the signal D1, the counter 120 starts to count time (e.g., counts clock cycles).

In decision step S140, it is decided whether the voltage level of the PWR reaches the second voltage V2. The power-on detector 100 waits (stands by) until the voltage level of the power supply voltage PWR reaches the second voltage V2. If a voltage level of the power supply voltage PWR reaches the second voltage V2 (YES branch of decision step S120), then step S150 is performed, in which the second voltage detector 130 activates a signal D2. In an exemplary embodiment, when the first voltage detector 110 activates the signal D1, a counter 120 starts to count time. In a case where the counter 120 starts to count time when the signal D1 is activated, the count value CNT of the counter 120 at the time of activation of the signal D2 corresponds to the time difference $\Delta t1$ between times t2 and t3.

In step S160, the calculator 140 calculates the slope of the power supply voltage PWR. For example, the calculator 140 may calculate the slope of the power supply voltage PWR based on the first voltage V1, the second voltage V2, and the count value CNT ($\Delta t1$). As described above, the count value CNT indicates the time difference between sequential activations of the signals D1 and D2.

In an exemplary embodiment, the calculator 140 calculates the slope of the power supply voltage PWR linearly. For example, the calculator 140 divides the voltage difference $\Delta V1$ (the difference between the voltages V1 and V2) by a time value corresponding to the time $\Delta t1$. The divided result may be deemed the slope of the power supply voltage PWR.

In alternative embodiments, the calculator 140 may be configured calculate a function of a voltage level of the power supply voltage PWR using the voltages V1 and V2 and the time $\Delta t1$. The function of the voltage level of the power supply voltage PWR may include a slope of the power supply voltage PWR. Thus, the calculator 140 may be configured to calculate the slope of the power supply voltage PWR via the function of the voltage level of the power supply voltage PWR. In another alternative embodiment, the calculator 140 may be configured to calculate an nth order function of the voltage level of the power supply voltage PWR. In still another alternative embodiment, the calculator 140 may be configured to calculate an exponential function of the voltage level of the power supply voltage PWR. In still another alternative embodiment, the calculator 140 may be configured to calculate a logarithmic function of the power supply voltage PWR.

In step S170, the calculator 140 calculates the time $\Delta t2$ necessary to reach a target voltage V3 based on the slope of the power supply voltage PWR.

In step S180, the calculator 140 waits until the time $\Delta t2$ elapses. In step S190, the calculator 140 may activate a signal RS when the time $\Delta t2$ elapses, at a time t4.

In various embodiments, the power-on detector 100 may be connected with an external electronic device. The power-on detector 100 may be supplied with the same power supply voltage PWR as the external electronic device. The second voltage V2 may be a minimum voltage such that elements of the external electronic device will operate normally without errors due that would be caused by too low a voltage level. The external electronic device may execute a booting operation in response to the signal RS. Thus, the power supply voltage PWR applied to the power-on detector 100 and the external electronic device may have a margin of voltage $\Delta V2$ with respect to the minimum voltage V2.

The power-on detector 100 according to the present invention may detect the first and second voltages V1 and V2, calculate the slope of the power supply voltage PWR, and calculate the time taken to reach a target voltage V3 based on the calculated slope. Accordingly, even if the slope of the power supply voltage PWR is not sharp, it is possible to provide a margin of a given value $\Delta V2$ with respect to the minimum voltage V2 necessary for error-free operation of the electronic device. It is possible to minimize the time taken to reach the target voltage V3 by calculating the time taken to reach the target voltage V3.

Figure 4:
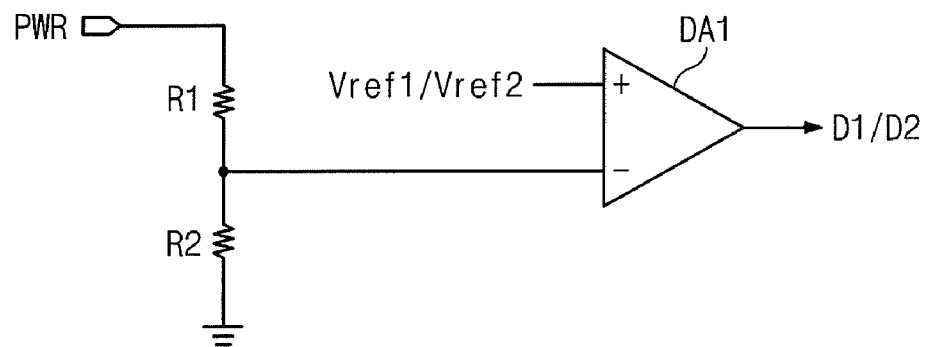
FIG. 4 is a circuit diagram of the first and second voltage detectors 110, 130 in the power-on detector 100 in FIG. 1.

FIG. 4 is a circuit diagram of the first and second voltage detectors 110, 130 in the power-on detector 100 in FIG. 1.

The first voltage detector 110 is the same as the second detector 130 and each of the first and second voltage detectors 110 and 130 is called a voltage detector. As illustrated in FIG. 4, the voltage detector 110/130 may include a voltage divider comprising resistors R1 and R2 and a differential amplifier DA1. The resistors R1 and R2 are connected serially between the power supply voltage PWR and a ground terminal. An inverting input of the differential amplifier DA1 is connected to an interconnection node of the resistors R1 and R2, and a reference voltage Vref1/Vref2 is applied to the non-inverting input. The differential amplifier DA1 outputs a positive voltage when a voltage obtained by dividing the power supply voltage PWR via the resistors R1 and R2 is higher than the reference voltage Vref1/Vref2. An output of the DA1 may be provided to the calculator 140 (refer to FIG. 1) as a signal D1/D2.

The first and second voltage detectors 110 and 130 are supplied with reference voltages Vref1 and Vref2, respectively. The first and second voltage detectors 110 and 130 output signals D1 and D2, respectively. The reference voltage Vref1 is different from the reference voltage Vref2. The reference voltage Vref1 applied to the first voltage detector 110 may be used as a voltage for detecting the first voltage V1. The reference voltage Vref2 applied to the second voltage detector 130 may be used as a voltage for detecting the second voltage V2.

Figure 5:
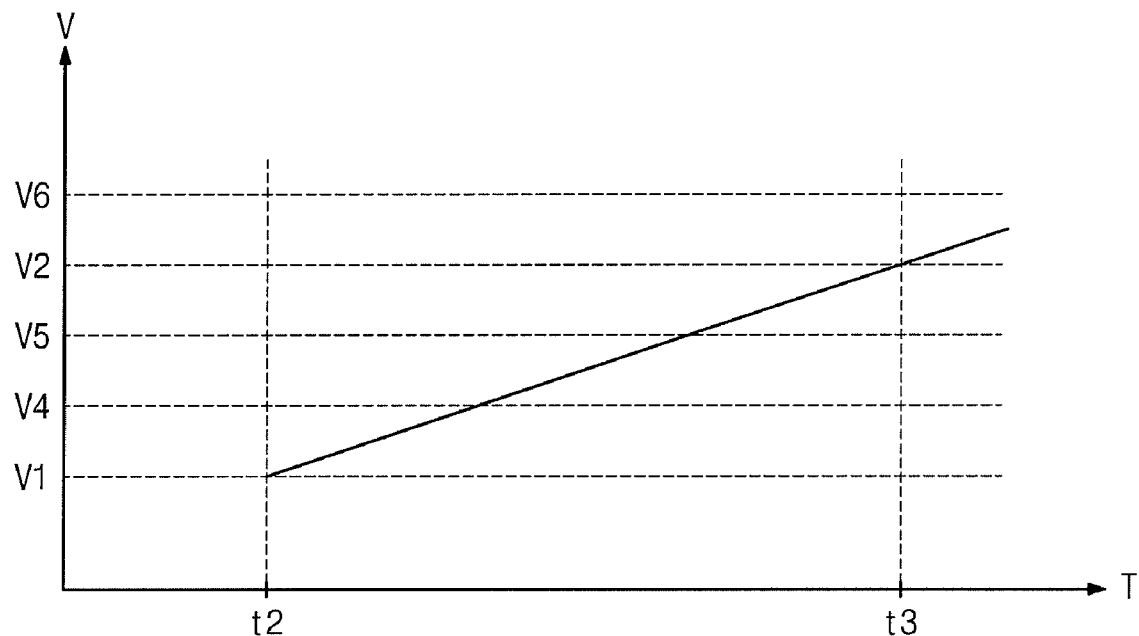
FIG. 5 is an enlargement of a portion of the graph in FIG. 2 showing the time period t2-t3.

FIG. 5 is an enlargement of a portion of the graph in FIG. 2 diagram showing the time period t2-t3. In FIG. 5, the horizontal axis indicates time T, and the vertical axis indicates the voltage V. A alternative embodiment of a power-on detector 100 according to the present invention will be described with reference to FIGS. 1 and 5.

The first voltage detector 110 detects the first voltage V1. The second voltage detector 130 detects voltages V2, V4, V5, and V6. The second voltage detector 130 activate signal D2 when a voltage level of a power supply voltage PWR reaches the second voltage V2. If a voltage level of the power supply voltage PWR does not reach the second voltage V2 after rising from the first voltage V1 within a predetermined time, the power-on detector 100 generates a signal indicating that an error occurred during the power-on operation. Further, the power-on detector 100 outputs a voltage level that is finally detected by the second voltage detector 130. In an exemplary embodiment, in a case where a voltage level of the power supply voltage PWR is higher than a voltage V5 and lower than a voltage V2, the voltage V5 is detected by the second voltage detector 130, and the voltage V2 is not detected. At this time, the power-on detector 100 may issue the voltage level of the voltage V5 as a final voltage level of the power supply voltage PWR.

As described above, if a slope of the power supply voltage PWR is lower than a given value, the power-on detector 100 according to the present invention may judge a power-on operation to be erroneous. Thus, it is possible to prevent the power-on determination from being delayed due to a low slope of the power supply voltage PWR. Further, if an error arises during the power-on detection operation, the power-on detector 100 may output a final voltage level of the power supply voltage PWR. This enables an error occurring during the power-on operation to be analyzed.

In the above-described embodiment, the power-on detector 100 is configured to calculate the slope of the power supply voltage PWR using the first voltage V1, the second voltage V2, and the first time Δt1. But, it is well understood that the power-on detector 100 can be configured to calculate the slope of the power supply voltage PWR based on voltages V1, V2, V4, V5, and V6 in FIG. 5 and the time taken until the voltage level of the power supply voltage PWR reaches the voltages V4, V5, V2, and V6 from the voltage V1. In this case, it is possible to calculate the slope of the PWR more accurately as compared with that calculated using only the first time Δt1.

In the above-described embodiment, the first voltage detector 110 of the power-on detector 100 activates signal D1 when the voltage level of the power supply voltage PWR reaches the first voltage V1. The second voltage detector 120 activates signal D2 when the voltage level of the power supply voltage PWR reaches the second voltage V2. The power-on detector 100 calculates the slope of the power supply voltage PWR based on the time that the voltage level of the power supply voltage PWR rises from the first voltage V1 to the second voltage V2. But, the power-on detector 100 according to the present invention is configured to calculate the slope of the power supply voltage PWR based on the first voltage V1, the first time Δt1, and the level of the power supply voltage PWR after the first time Δt1 elapses.

For example, as illustrated in FIGS. 1, 2, and 5, if the voltage level of the power supply voltage PWR reaches the first voltage V1 at time t1, the first voltage detector 110 activates a signal D1. The counter 120 is activated by the activation of the signal D1. The power-on detector 100 waits until a given time Δt1 elapses, using the time count value CNT from the counter 120. While the given time Δt1 elapses, the second voltage detector 130 may detect a voltage level of the power supply voltage PWR. For example, if the voltage level of the power supply voltage PWR is lower than a voltage V5 and higher than a voltage V4, it may be detected as the voltage V4. For ease of description, it is assumed that the voltage level of the power supply voltage PWR is detected at the second voltage V2.

A calculator 140 calculates the slope of the power supply voltage PWR using the first voltage V1, a voltage V2 detected by the second voltage detector 130, and a given time Δt1. For example, the calculator 140 may calculate the slope of the power supply voltage PWR using an nth order function, an exponential function, or a logarithmic function of the voltage level of the power supply voltage PWR.

The calculator 140 calculates the time Δt2 taken for a voltage level of the power supply voltage PWR to reach a target value V3, using the calculated slope. The power-on detector 100 may wait until the time Δt2 elapses, using the count value CNT from the counter 120. If the time Δt2 elapses, the calculator 140 activates signal RS. Thus, the power-on detector 100 activates the signal RS after the voltage level of the power supply voltage PWR applied from the external source is stabilized at a voltage level higher than the minimum voltage level of an electronic device connected to the power-on detector 100 and is supplied with the same power supply voltage PWR as the power-on detector 100. An electronic device connected with the power-on detector 100 may safely perform a booting operation in response to the signal RS.

Figure 6:
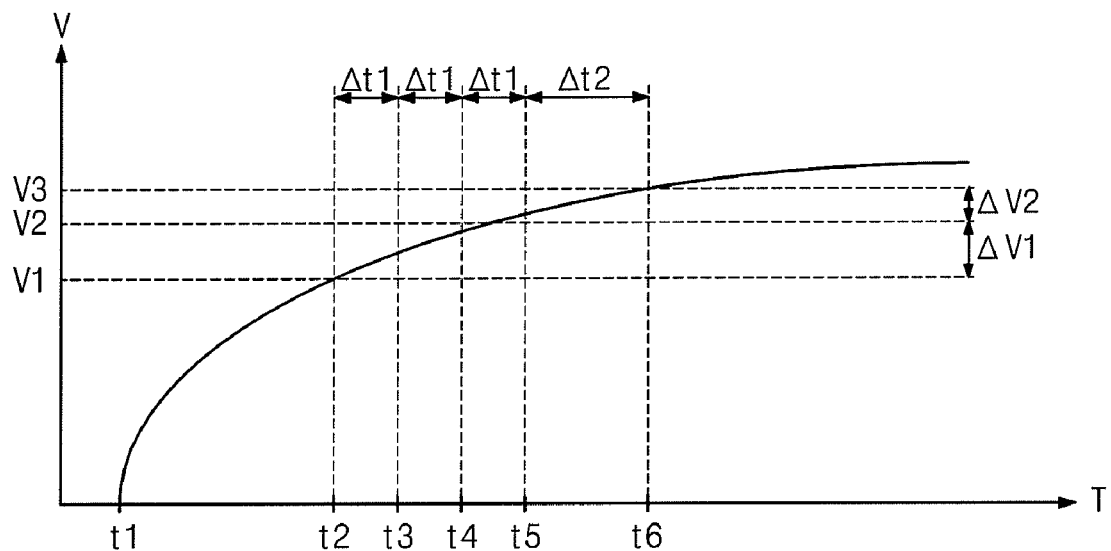
FIG. 6 is a diagram showing a variation of a power supply voltage provided from the external power source.

FIG. 6 is a diagram showing a variation of a power supply voltage provided from the external source. In FIG. 6, the horizontal axis indicates time T, and the vertical axis indicates voltage V.

Figure 7:
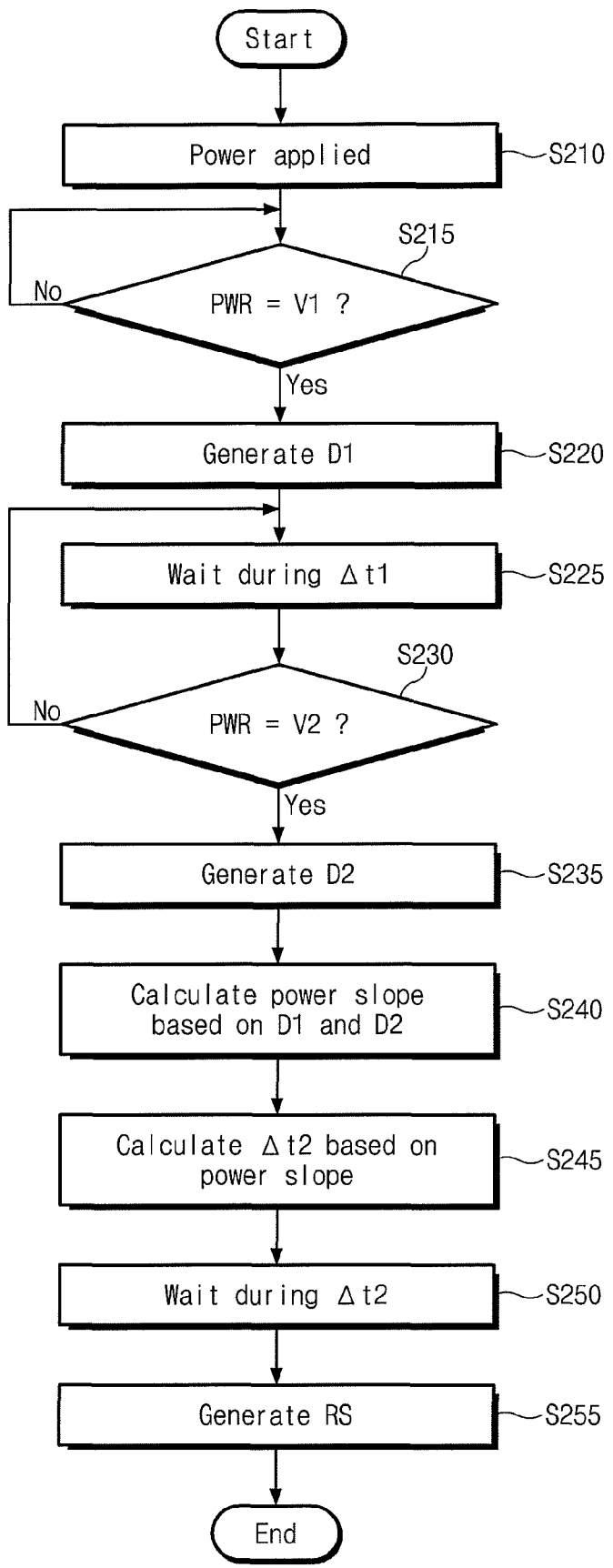
FIG. 7 is a flow chart of the method of operation of the power-on detector 100 of FIG. 1 given the variation of a power supply voltage illustrated in FIG. 6.

FIG. 7 is a flow chart for of the method of operation of the power-on detector 100 of FIG. 1 given the variation of a power supply voltage illustrated in FIG. 6.

Referring to FIGS. 1, 6, and 7, in step S210, a power supply voltage PWR is applied to the power-on detector 100. As illustrated in FIG. 6, a voltage level of the power supply voltage PWR starts to increase at time t1 (e.g., the power supply voltage PWR turns "ON" at the time t1).

In step decision S215, the power-on detector 100 decides whether a voltage level of the power supply voltage PWR has reached the first voltage V1. If the voltage level of the power supply voltage PWR reaches the first voltage V1 (YES branch of decision step S215), then in step S220, the first voltage detector 110 activates signal D1.

In step S225, the power-on detector 100 waits the first time interval Δt1 using a count value CNT from a time (clock) counter 120. In decision step S230, the power-on detector 100 decides whether the voltage level of the power supply voltage PWR has reached the second voltage V2. If the voltage level of the power supply voltage PWR is decided to have reached the second voltage V2 (YES branch of decision step S230), then in step S235 the second voltage detector 130 activates the signal D2. If the signal D2 is not activated (NO branch of decision step S230), step S225 is repeated and the power-on detector 100 waits again for the first time interval Δt1.

In step S240, the calculator 140 calculates the slope of the power supply voltage PWR. The calculator 140 calculate the slope of the power supply voltage PWR based on the first voltage V1, the second voltage V2, and a time interval Δt1 (for example, 3*Δt1). The time interval Δt1 may be a predetermined time counted until it is decided whether the voltage level of the power supply voltage PWR has reached the second voltage V2 rising from the first voltage V1. For example, the calculator 140 may calculate the slope of the power supply voltage PWR using an nth order function, an exponential function, or a logarithmic function of a voltage level of the power supply voltage PWR.

In step S245, the calculator 140 calculates the time Δt2 expected to take for the power supply voltage PWR to reach a target voltage V3, based on the calculated slope. In step S250, the power-on detector 100 waits until the time Δt2 elapses using a count value CNT from the counter 120. When the calculated time Δt2 elapses, in step S255, the calculator 140 generates signal RS.

The power-on detector 100 activates the signal RS after a voltage level of the power supply voltage PWR applied from the external source is stabilized at a voltage level higher than the minimum voltage level of an electronic device connected with the power-on detector 100 and supplied with the same power supply voltage PWR as the power-on detector 100. The electronic device connected with the power-on detector 100 may safely perform a booting operation in response to the signal RS.

As described above, the power-on detector 100 according to the present invention calculates the slope of the power supply voltage PWR to calculate the time Δt2 expected for the voltage level of the power supply voltage PWR to reach a target voltage V3. After the calculated time Δt2 elapses, the power-on detector 100 activates the signal RS.

The power-on detector 100 according to the present invention may applied to all sorts of electronic devices that are supplied with a power supply voltage PWR from the external source and that need to perform a given operation (for example, a booting operating such as a power-on read operation) to reach a standby state.

Figure 8:
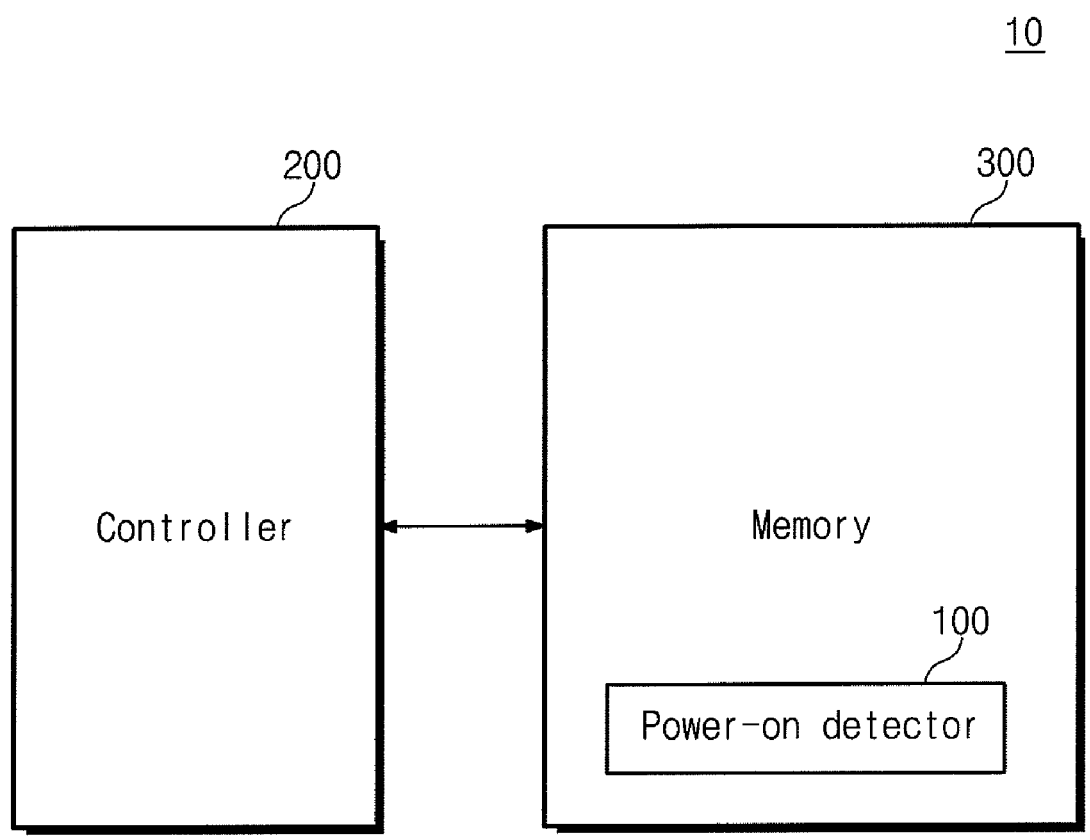
FIG. 8 is a block diagram of a memory system including the power-on detector 100 of FIG. 1 according to an embodiment of the present invention.

FIG. 8 is a block diagram showing a memory system including the power-on detector 100 of FIG. 1 according to the present invention. Referring to FIG. 8, a memory system 10 including the power-on detector 100 of FIG. 1 according to an exemplary embodiment of the present invention includes a memory device 300 and a memory controller 200.

The memory controller 200 is connected with a host (computer, not shown) and to the memory device 300. The memory controller 200 may be configured to read data from the memory device and to transfer the read data to the host. The memory controller 200 may be configured to store data transferred from the host in the memory device 300.

The memory controller 200 may include constituent elements such as RAM, a processing unit, a host interface, and a memory interface. The RAM may be used as the working memory of the processing unit. The processing unit may control the overall operation of the memory controller 200. The host interface may include a protocol for conducting data exchange between the host and the controller 200. For example, the memory controller 200 may be configured to communicate with the external (for example, host) using one selected from a group of USB, MMC, PCI-E, ATA, SATA, PATA, SCSI, ESDI, and IDE interfaces. The memory interface of the memory controller 200 interfaces with the memory device 300. The memory controller 200 may further comprise an ECC block configured to detect errors of data read from the memory device 300 and to correct the detected errors.

The memory device 300 includes a memory cell array for storing data, a read/write circuit for writing and reading data into and from the memory cell array, an address decoder for decoding an externally applied address to transfer the decoded result to the read/write circuit, control logic for controlling the overall operation of the memory device 300.

For example, the memory device 300 may include a volatile memory device such as DRAM, SDRAM, SRAM, or the like. In another embodiment, the memory device 300 may include a non-volatile memory device such as ROM, PROM, EPROM, EEPROM, a flash memory, PRAM, MRAM, RRAM, FRAM, or the like.

The memory device 300 includes the power-on detector 100 of FIG. 1 according to the present invention. The power-on detector 100 may be configured to perform the same operations as described in FIGS. 1 to 7. The memory device 300 may perform a booting operation in response to the signal RS provided from the power-on detector 100. For example, if the memory device 300 is a non-volatile memory device, the memory device 300 may perform a power-on read operation in response to the signal RS.

In FIG. 8, the memory device 300 includes the power-on detector 100 according to the present invention. But, it is understood that the memory controller 200 may configured to include the power-on detector 100. In that case, the memory controller 200 may perform a booting operation in response to the signal RS from the power-on detector 100.

Further, the power-on detector 100 may be configured to be included as an element of a memory system, with no power-on detector 100 included in the memory controller 200 and the memory device 300. In that case, the controller 200 and the memory device 300 may perform a booting operation in response to the signal RS from the power-on detector 100. For example, the memory system 10 may perform a power-on read operation. In the event that the memory device 300 is a NAND flash memory device, the booting operation may include an operation where a register is filled with information for mapping the physical and logical addresses of the memory device 300.

The memory controller 200 and the memory device 300 may be integrated in one semiconductor substrate. The memory controller 200 and the memory device 300 may be configured to implement a memory card. The memory controller 200 and the memory device 300 may be configured to implement one selected from a group of PC card (PCMCIA), Compact Flash (CF) card, Smart Media (SM) card, memory stick, MMC/RS-MMC/MMCmicro, SD/miniSD/microSD, UFS, and the like.

In another embodiment, the memory controller 200 and the memory device 300 may be configured to implement a Solid State Drive/Disk (SSD).

In another embodiment, the memory system 10 may be included in apparatus such as PDA, portable computer, web tablet, wireless phone, mobile phone, digital music player, or devices for sending and receiving information in a wireless environment.

The memory device 300 or the memory system 10 may be packed in various package types such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), the like.

Figure 9:
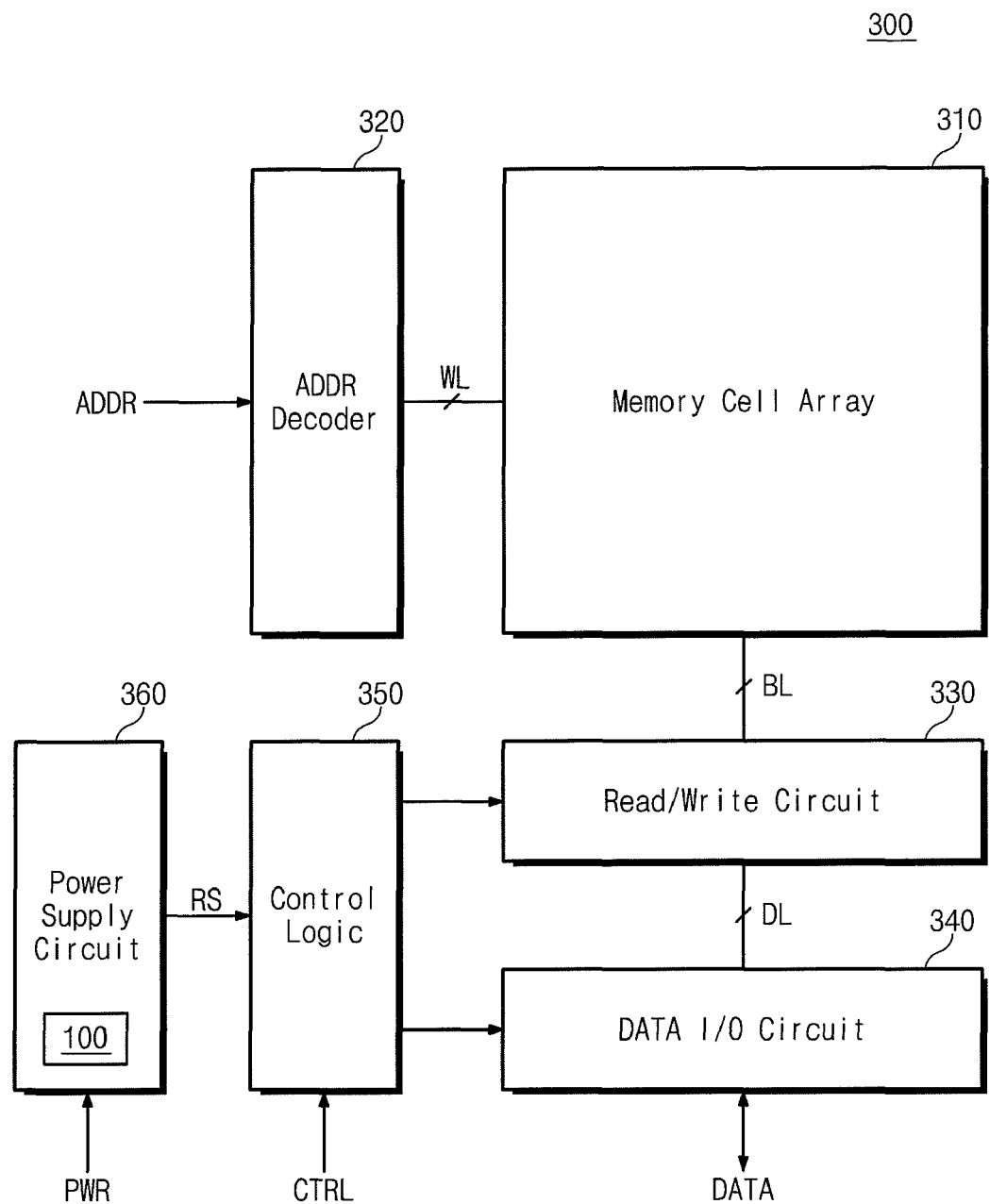
FIG. 9 is a block diagram of the memory device 300 shown in FIG. 8, including the power-on detector 100 of FIG. 1.

FIG. 9 is a block diagram of a memory device 300 shown in FIG. 8 including the power-on detector 100 of FIG. 1 according to the present invention. Referring to FIG. 9, a memory device 300 may include a memory cell array 310, an address decoder 320, a read/write circuit 330, a data input/output circuit 340, control logic 350, and a power supply circuit 360.

The memory cell array 310 is connected to the address decoder 320 via word lines WL and to the read/write circuit 330 via bit lines BL. The memory cell array 310 includes memory cells for storing data.

In an exemplary embodiment implementing a non-volatile memory device, each memory cell in the memory cell array 310 may include a transistor having a charge storage layer. Such memory cell transistors store data by accumulating/trapping charge in their charge storage layers.

In an exemplary embodiment, implementing a non-volatile memory, each memory cell of the memory cell array 310 may be a variable resistance memory cell such as ferroelectric elements, phase change elements, or magnetic elements of FRAM, PRAM, or MRAM for storing data using a variable resistance.

The memory cells of the memory cell array 310 may be arranged in a matrix. Each Row of memory cells in the matrix are connected to one of the word lines WL and each columns of memory cells in the matrix are connected to one of the bit lines BL.

The address decoder 320 is connected with the memory cell array 310 via the word lines WL. The address decoder 320 operates in response to the control of the control logic 350. The address decoder 320 decodes an address ADDR provided from the external source. The address decoder 320 may decode a row address of the address ADDR to select the word lines WL. The address decoder 320 decodes the column address of the address ADDR to provide the decoded result to the read/write circuit 330. In an exemplary embodiment, the address ADDR may be supplied from the memory controller 200 in FIG. 8. The address decoder 320 includes elements such as an address buffer, a row decoder, a column decoder.

The read/write circuit 330 is connected with the memory cell array 310 via the bit lines BL and to the data input/output circuit 340 via data lines DL. The read/write circuit 330 operates in response to the control of the control logic 350. The read/write circuit 330 selects the bit lines in response to an address decoded by the address decoder 320. The read/write circuit 330 writes data transferred from the data input/output circuit in the memory cell array 310. The read/write circuit 330 sends data read from the memory cell array 310 to the data input/output circuit 340. The read/write circuit 330 may write data read from the first storage area of the memory cell array 310 in the second storage area different from the first storage area. In an exemplary embodiment, the read/write circuit 330 may include elements such as a write driver, a sense amplifier, a column selector circuit, and the like. In another embodiment, the read/write circuit 330 may include elements such as a page buffer, a column selector circuit, and the like.

The data input/output circuit 340 is connected with the read/write circuit 330 via the data line DL. The data input/output circuit 340 operates in response to the control of the control logic 350. The data input/output circuit 340 exchanges data with the external. The data input/output circuit 340 transfers the received data to the read/write circuit 330. The data input/output circuit 340 sends data provided from the read/write circuit 330 to the external host. In an exemplary embodiment, the data input/output circuit 340 may exchange data with the memory controller 200 in FIG. 8. The data input/output circuit 340 may include elements such as a data buffer.

The control logic 350 controls the overall operation of the memory device 300. The control logic 350 operates in response to a control signal CTRL from the external host. In an exemplary embodiment, the control signal CTRL may be supplied from the controller 200 in FIG. 8.

The power supply circuit 360 powers the memory device 300. In an exemplary embodiment, the power supply circuit 360 receives a power supply voltage PWR from the external source to power elements of the memory device 300. In an exemplary embodiment, the power supply circuit 360 rectifies a power supply voltage PWR received from the external source and powers elements of the memory device 300. In another embodiment, the power supply circuit 360 converts the voltage level of a power supply voltage PWR received from the external source and powers elements of the memory device 300.

The power supply circuit 360 includes the power-on detector 100 of FIG. 1. The power-on detector 100 may operate in the same manner as described in FIGS. 1 to 7. If a voltage level of the power supply voltage PWR reaches a target voltage V3, the power-on detector 100 may activate signal RS. The control logic 350 may perform a booting operation (for example, a power-on read operation) in response to the activated signal RS.

Figure 10:
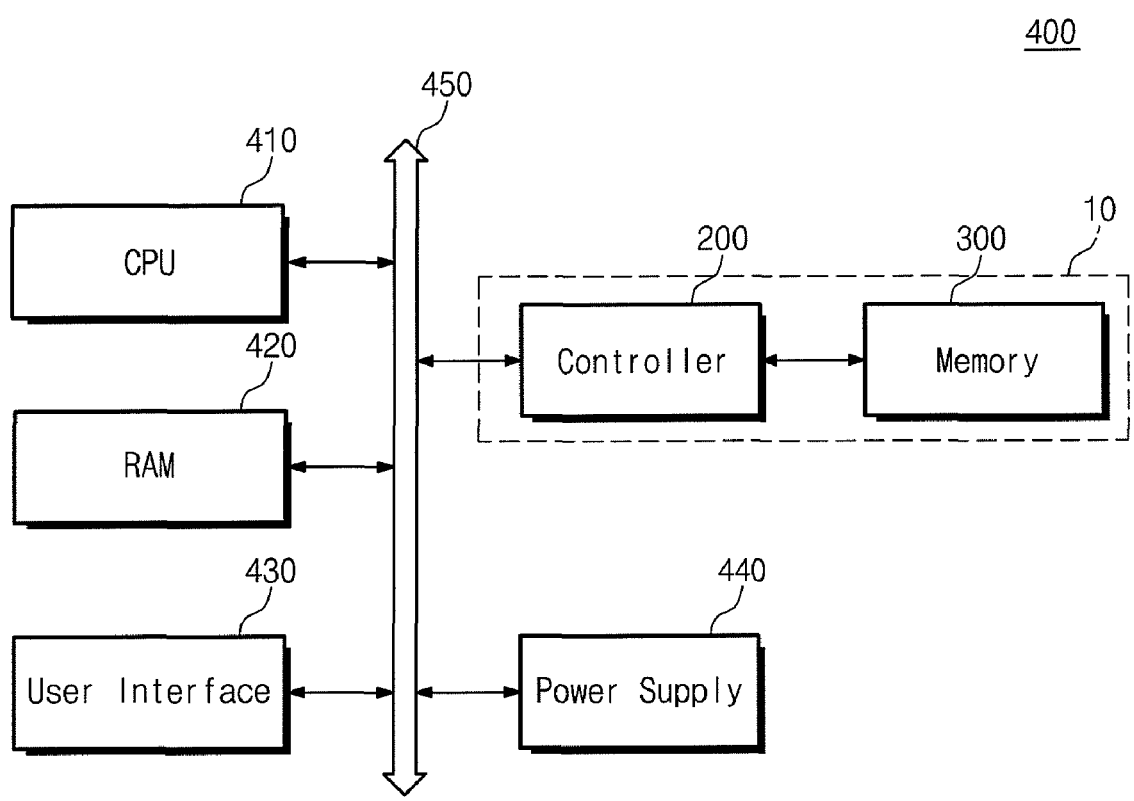
FIG. 10 is a block diagram of a computing system 400 including the memory system 10 of FIG. 8.

FIG. 10 is a block diagram showing a computing system including a memory system 10 of FIG. 8. Referring to FIG. 10, a computing system 400 may include a central processing unit CPU 410, a random access memory RAM 420, a user interface 430, a power supply 440, and a memory system 10.

The memory system 10 is electrically connected with the CPU 410, the RAM 420, the user interface 430, and the power supply via a system bus 450. Data provided via the user interface 430 or processed by the CPU 410 is stored in the memory system 10. The memory system 10 may include the memory controller 200 and a memory device 300.

As described in FIG. 8, the memory system 10 may include the power-on detector 100 of FIG. 1. In an exemplary embodiment, it is possible to configure elements such as the processor 410, the RAM 420, and the user interface 430 so as to include the power-on detector 100. Further, the power-on detector 100 need not be incorporated in elements 410 to 430 of the computing system but rather in the power supply 440.

The power-on detector 100 in the computing system 400 may operate in the same way as described in FIGS. 1 to 7. The computing system 400 may operate a signal RS provided from the power-on detector 100. In an exemplary embodiment, the computing system 400 performs a Power-On Self Test (POST) operation in response to the signal RS.

Although not shown in FIG. 10, the computing system 400 may further comprise an application chipset, a camera image processor, and the like.

In the above exemplary embodiments, there are described a memory device 300, a memory system 10, and a computing system 400 which include a power-on detector 100, respectively. But, the present invention is not limited to embodiments where the power-on detector 100 is included in the memory device 300, the memory system 10, and the computing system 400. It is well understood that the power-on detector 100 may be applied to all sorts of electronic devices that are supplied with the power supply voltage PWR from the external source and necessitate a given operation (for example, a booting operating such as a power-on read operation) to reach a standby state.

The power-on detector according to the present invention is configured to calculate the slope of a power supply voltage from the external source and to calculate the time expected to take for the power supply voltage to reach a target voltage level based on the calculated slope. Thus, it is possible to make a voltage level of the power supply voltage to be stabilized at a voltage higher than the required minimum voltage level. Further, it is possible to minimize the time taken until a voltage level of the power supply voltage reaches a voltage level identical to or higher than the required minimum voltage level.

The above-disclosed subject matter is to be considered illustrative, and not restrictive, and the appended claims are intended to cover all modifications, enhancements, and other embodiments, which fall within their spirit and scope. Thus, to the maximum extent allowed by law, the scope of the claims is to be determined by the broadest permissible interpretation of the following claims and their equivalents, and shall not be restricted or limited by the foregoing detailed description.

What is claimed is:

1. An operating method of a power-on detector supplied with a power supply voltage from an external source and operates in response to a variation of the power supply voltage, the operating method comprising:
   calculating a slope of rise of the power supply voltage;
   calculating the time it will take for the voltage level of the power supply voltage to rise to a target voltage level, based on the calculated slope; and
   wherein calculating the slope of the power simply voltage is based on a first voltage, a second voltage, and the measured time taken until the power supply voltage rises to the second voltage from the first voltage.

2. The operating method of claim 1, further comprising generating a signal indicating that an error occurred during a power-on operation, wherein when the measured time taken until the power supply voltage rises to the second voltage from the first voltage, is more than a predetermined time.

3. An operating method of a power-on detector supplied with a power supply voltage from an external source and operates in response to a variation of the power supply voltage, the operating method comprising:
   calculating a slope of rise of the power supply voltage;
   calculating the time it will take for the voltage level of the power supply voltage to rise to a target voltage level, based on the calculated slope, wherein calculating the slope of the power supply voltage is based on a first voltage, a first time, and measuring the level of the power supply voltage when the first time elapses after the power supply voltage was at the first voltage.

4. An operating method of a power-on detector supplied with a power supply voltage from an external source and operates in response to a variation of the power supply voltage, the operating method comprising:
 calculating a slope of rise of the power supply voltage;
 calculating the time it will take for the voltage level of the power supply voltage to rise to a target voltage level, based on the calculated slope; and
 further comprising generating a control signal when the power supply voltage reaches the target voltage level.

5. A power-on detector comprising:
 a first voltage detector configured to detect whether the voltage level of a power supply voltage provided from an external source reaches a first voltage;
 a second voltage detector configured to detect whether the voltage level of the power supply voltage reaches a second voltage higher than the first voltage;
 a time counter configured to output a count value; and
 a calculator configured to calculate the slope of the power supply voltage based on the first voltage, the second voltage, and the count value output by the counter when the voltage level of the power supply voltage reaches the second voltage from the first voltage.

6. The power-on detector of claim 5, wherein the calculator calculates the time that the power supply voltage is expected to reach a target voltage level, based on the calculated slope, and detects an elapse of the calculated time using a count value from the time counter.

7. The power-on detector of claim 6, wherein the calculator is further configured to output a control signal when the calculated time elapses.

8. A memory device comprising:
 a memory cell array;
 a read/write circuit configured to access the memory cell array; and
 a power supply circuit configured to power the memory cell array and the read/write circuit,
 wherein the power supply circuit calculates the slope of rise of a power supply voltage provided from an external source, calculates the time taken for the power supply voltage to reach a target voltage level based on the calculated slope, and generates a control signal when the calculated time elapses.

9. The memory device of claim 8, wherein the memory device performs a booting operation in response to the control signal.

10. The memory device of claim 8, wherein the memory device is integrated with an external controller for controlling the memory device.

* * * * *